United States Patent [19]

Lindstrom

[11] Patent Number: 4,668,608

[45] Date of Patent: May 26, 1987

[54] NEGATIVE-WORKING, NON-SWELLING RESIST

[75] Inventor: Michael J. Lindstrom, Downingtown, Pa.

[73] Assignee: Eastman Kodak Company, Rochester, N.Y.

[21] Appl. No.: 903,863

[22] Filed: Sep. 2, 1986

Related U.S. Application Data

[63] Continuation of Ser. No. 734,646, May 16, 1985, abandoned.

[51] Int. Cl.$^4$ ............... G03C 1/727; G03C 1/733; G03F 7/26
[52] U.S. Cl. ............... 430/292; 430/270; 430/338; 430/915; 430/927
[58] Field of Search ............... 430/270, 292, 338, 915, 430/927

[56] References Cited

U.S. PATENT DOCUMENTS

| | | | |
|---|---|---|---|
| 2,855,303 | 10/1958 | Chalkley | 430/338 |
| 3,131,062 | 4/1964 | Agtuss | 430/338 |
| 3,306,748 | 2/1967 | Chalkley | 430/338 |
| 4,006,023 | 2/1977 | McLaughlin et al. | 526/77 |
| 4,255,513 | 3/1981 | Laridon et al. | 430/281 |
| 4,373,017 | 2/1983 | Masukawa et al. | 430/338 |

OTHER PUBLICATIONS

"Dosimetry for Lithographic Applications", *J. Vac. Sci. Technol.,* vol. 19, No. 4, Nov./Dec. 1981, pp. 1343–1347, Shaw et al.

*J. of Organic Chemistry of the USSR,* vol. 8, pp. 1701–1705, 1973.

*Primary Examiner*—Richard L. Schilling
*Attorney, Agent, or Firm*—William J. Davis

[57] ABSTRACT

There are disclosed negative-working resist compositions featuring a binder and a radiation-sensitive compound that loses HX upon exposure, to become less soluble in an aqueous base. X is selected from the group consisting of —CN, halide, and —SO$_2$R$^1$, and R$^1$ is alkyl of 1–5 carbon atoms or aryl of from 6 to 10 carbon ring atoms.

3 Claims, No Drawings

NEGATIVE-WORKING, NON-SWELLING RESIST

This is a continuation of application Ser. No. 734,646, filed May 16, 1985, now abandoned.

FIELD OF THE INVENTION

This invention relates to photographically negative-working compositions suitable for exposure to activating radiation such as UV light to form a resist image.

BACKGROUND OF THE INVENTION

One of the frontiers of photoresists involves the need for greater resolution, that is, for the resolution of smaller and smaller line widths. The reason is that semiconductor devices using such resists are packing more and more devices onto the same real estate. This is done primarily by reducing the dimensions of the devices—hence the need for smaller line widths.

The reduction in line widths has proceeded to 1 $\mu$m or less, both in the line width and in the spacing. One result of this phenomenon has been the gradual abandoning by the industry of negative-working light-sensitive resists, that is, those having decreased solubility upon exposure to light, in favor of positive-working resists. Unlike the case with positive-working resists, the negative-working light-sensitive resists have a great tendency to swell upon development. Swelling is not a significant problem for line widths and spacings greater than 2 $\mu$m. But at 1 $\mu$m spacing or less, swelling of most negative-working resists has been enough to bridge the 1 $\mu$m spacing, resulting in stringers and other unacceptable defects noticeable upon drying.

What then has been needed prior to this invention is a negative-working light-sensitive resist that has no observable swelling, during development, when the image has 1 $\mu$m widths and spaces. The fact that positive-working resists will do this is not completely adequate—the availability of a negative-working light-sensitive resist would greatly expand the possible chemistries and more closely fit the processing format of some circuit designers.

Compounds have been known prior to this invention for use in resists to generate color upon exposure, as a print-out indication of exposure dosage and uniformity. Some of these, for instance nitrile-substituted aminotriphenyl methane dyes, have been found to lose a —CN moiety upon exposure, as explained in "Dosimetry for Lithographic Applications", *J. Vac. Sci, Technol.*, Vol. 19, No. 4, Nov./Dec. 1981, p. 1343–1347. However, such compounds have not been identified, prior to this invention, as providing differential solubility. Thus, they have not been recognized as the basis for providing sensitivity to the resist, and most importantly, have not been appreciated as the basis for a negative-working resist free from swelling. Therefore, when used in resists to produce 1 $\mu$m line widths or spacing, the prejudice in the trade against negative-working resists has limited such compounds to use in positive-working resists.

SUMMARY OF THE INVENTION

I have discovered a negative-working resist that avoids the problem of swelling noted above, by a mechanism that is not entirely clear.

Thus it is an advantageous feature of the invention that a negative-working resist is provided that produces no observable swelling when developed to form line widths and spacings of 1 $\mu$m or less.

It is another advantageous feature of the invention that such a resist is sensitive to deep UV exposures.

Yet another advantageous feature of the invention is that the same radiation-sensitive compound providing differential solubility also can provide print-out color for the resist.

These features result, more specifically, from a negative-working light-sensitive resist comprising a binder and a radiation-sensitive compound that, upon exposure to activatng radiation, loses the moiety HX and is converted to a colored compound that is less soluble in an aqueous base than is the compound prior to the exposure. "X" in this formula is selected from the group consisting of —CN, halide and —SO$_2$R$^1$; and R$^1$ is alkyl comprising from 1 to 5 carbon atoms or aryl comprising from 6 to 10 carbon ring atoms.

In accord with another aspect of the invention, there is also provided a method of producing a negative-working image in a resist composition. The method comprises the steps of (a) imagewise-exposing to activating radiation the aforesaid composition, and (b) developing the exposed composition with an aqueous base so that only the exposed areas remain.

Other advantageous features of this invention will become apparent upon reference to the following Description of the Preferred Embodiments.

DESCRIPTION OF THE PREFERRED EMBODIMENTS

Certain compounds have been found to unexpectedly produce non-swelling negative-working resists when exposed to activating radiation. Although these compounds will be discussed primarily in connection with their preferred exposure sources, namely deep UV light sources defined as those having wavelengths including the range of 200–300 nm, they are also useful with other activating radiation.

The ability of these compounds to provide differential solubility to a selected solvent is well understood—it arises from the loss of an HX moiety upon exposure, causing the compound to transform into a form which is more insoluble in developer, wherein X is selected from the group consisting of —CN; halide such as chloride, fluoride, and the like; and —SO$_2$R$^1$; and R$^1$ is alkyl of from 1 to 5 carbon atoms, such as methyl, ethyl, propyl, isopropyl and the like; or aryl of from 6 to 10 carbon ring atoms, such as phenyl and naphthyl. What is not well understood is why this reaction and the compounds that provide it should be free of the swelling that plagues other negative-working resists.

In the process of forming the less soluble species, the resist of this invention reacts more at the surface, so that upon development the resist is undercut somewhat. This lends itself to using the resist in conventional lift-off techniques, since undercut resists are not likely to remain connected to adjacent components.

Particularly useful compounds for this resist comprise those having the structural formula

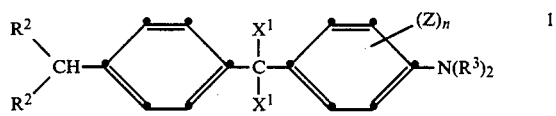

which is colorless, wherein $R^2$ and $X^1$ are individually selected from the group noted above for X. That is, $X^1$ is a species of the class of X moieties noted. When exposed, these compounds lose $HX^1$ to form

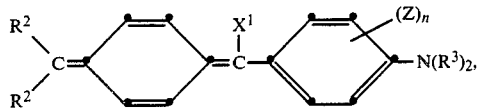

a colored species. In compunds 1 and 2 above, each $R^3$ is independently H, alkyl of from 1 to 5 carbon atoms, such as methyl, ethyl, propyl, isopropyl and the like, or benzyl; or together the two $R^3$ moieties form with the N atom, a heterocyclic ring of 5 or 6 ring atoms each such as, morpholino or a pair of fused heterocyclic rings of 5 or 6 ring atoms each such as julolidyl; n is 1 or 2; and Z is any substituent, or hydrogen, which upon exposure does not interfere with the negative-working properties of the resist. That is, Z is selected so as to produce no significant increase in solubility in aqueous bases such as are useful as developers. For example, Z can be H, alkyl of from 1 to 5 carbon atoms, such as methyl, ethyl, propyl, isopropyl and the like; benzo; or alkoxy of from 1 to 5 carbon atoms, such as methoxy, ethoxy, propoxy, and the like.

Particularly preferred examples from this class of compounds include:

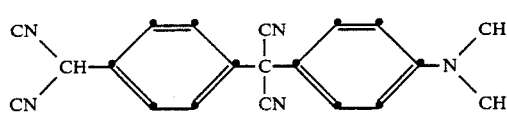

4-(α, α-dicyano-4-dicyanomethylbenzyl)-N,N-dimethylaniline;

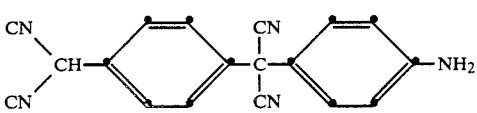

4-(α, α-dicyano-4-dicyanomethylbenzyl)aniline;

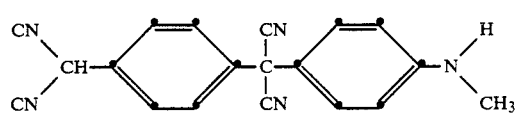

4-(α, α-dicyano-4-dicyanomethylbenzyl)-N-methylaniline;

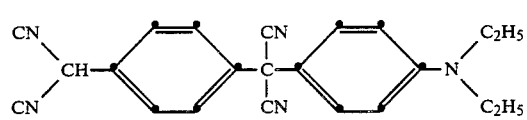

4-(α,α-dicyano-4-dicyanomethylbenzyl)-N,N-diethylaniline;

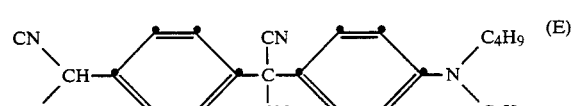

4-(α,α-dicyano-4-dicyanomethylbenzyl)-N,N-dibutylaniline;

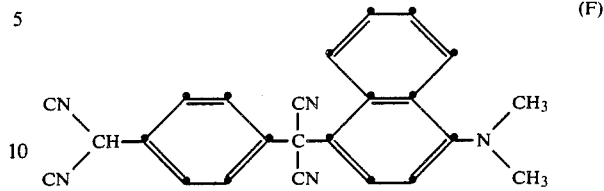

4-(α,α-dicyano-4-dicyanomethylbenzyl)-N,N-dimethyl-1-naphthylamine;

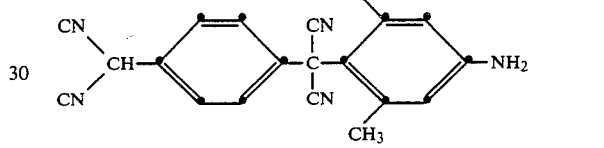

4-(α,α-dicyano-4-dicyanomethylbenzyl)-3-methoxyaniline;

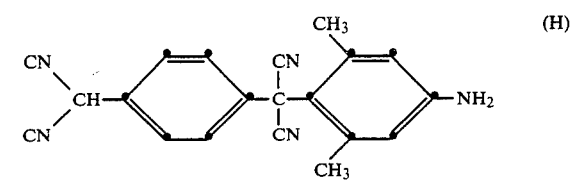

4-(α,α-dicyano-4-dicyanomethylbenzyl)-3,5-dimethylaniline;

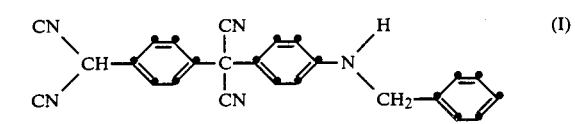

4-(α,α-dicyano-4-dicyanomethylbenzyl)-N-benzylaniline;

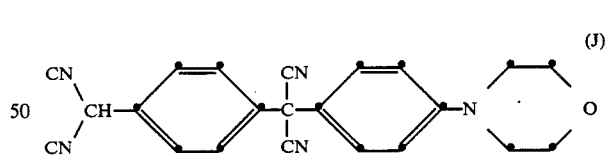

4-(α,α-dicyanol-4-dicyanomethylbenzyl)-1-morpholinobenzene; and

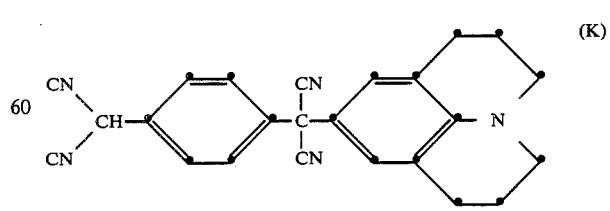

9-(α,α-dicyano-4-dicyanomethylbenzyl)julolidene.

Another useful class of colorless compounds includes those having the structural formula

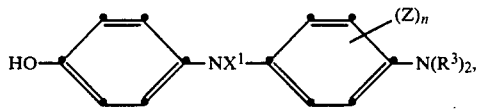

wherein $X^1$, $R^3$, Z and n have the meaning noted above. Upon exposure, such compounds also lose $HX^1$ and form

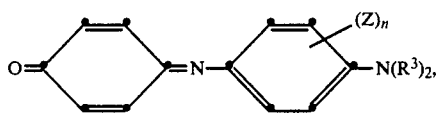

also a colored species. Although this class tends to show more thickness loss upon development, an undesirable feature, it is considered that other, more selective aqueous base developers can be used with this class to keep such thickness losses within acceptable ranges. Examples include those developers that include tetraalkylammonium or phosphonium cations, such as are described in U.S. Pat. No. 4,423,138, issued on 12/17/83.

Although it is not essential, it is preferred that the compounds of this invention that lose the moiety HX to provide differential solulibity, be the sole radiation-sensitive compounds of the composition, to insure the lack of swelling upon development.

Synthesis of the compounds of class (1) or (3) proceeds generally as follows:

For class (1),

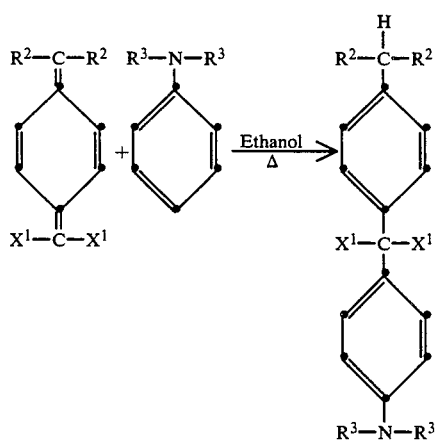

More particularly, Compound A has been synthesized as follows:

1 g of tetracyanoquinodimethane and 0.6 g N,N-dimethylaniline were refluxed in 30 mL of ethanol for 1 hour. The dark green solution was filtered hot and allowed to cool. The resulting crystals were collected, washed with additional; ethanol and air dried to yield 1.3 g light yellow plates M.P. 145°–7° C.

Calculated: C, 73.8; H, 4.6; N, 21.5. Found: C, 73.3; H, 4.8; N, 21.3.

Table I lists other representative compounds of the invention that have been prepared similarly.

TABLE I

| Compound | % Yield | M.P. °C. | Analysis Calc'd./Found | | |
|---|---|---|---|---|---|
| | | | C | H | N |
| B | 55 | 140–1 | 72.7/71.1 | 3.7/3.9 | 23.6/23.1 |
| C | 50 | 110–112 | 73.3/73.1 | 4.2/4.4 | 22.5/22.8 |
| D | 35 | 95–6 | 74.8/74.1 | 5.4/5.3 | 19.8/19.9 |
| E | 40 | 97–8 | 76.3/75.9 | 6.6/6.6 | 17.1/17.3 |
| F | 50 | 82–95 | 76.8/77.0 | 4.6/5.2 | 18.7/17.3 |
| G | 37 | 108–9 | 69.7/69.1 | 4.0/4.3 | 21.4/20.9 |
| H | 63 | 192–4 | 73.8/73.8 | 4.6/5.1 | 21.5/21.7 |
| I | 32 | 137–8 | 77.5/77.4 | 4.4/4.3 | 18.1/18.1 |
| J | 67 | 175–6 | 71.9/71.4 | 4.7/4.6 | 19.1/18.9 |
| K | 43 | 147–8 | 76.4/76.2 | 5.1/5.1 | 18.6/18.5 |

A similar synthesis is used to prepare compounds of class (3) above, except that dimethylformamide is used as the solvent in place of ethanol.

Any binder is useful in this composition, such as conventional non-radiation sensitive binders. Particularly useful examples include the well-known novolak resins, that is, those having the structural formula:

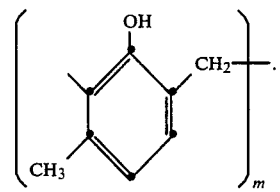

Other aromatic, base soluble binders having good plasma etch resistance and thermal resistance to at least 150° C. are also particularly useful.

Other addenda can be optionally added to the composition, for example, stabilizers, surfactants, and the like.

EXAMPLES

The following examples further illustrate the scope of the invention.

EXAMPLE 1

Use of class 1 compound

The following composition was spin-coated at 4000 rpm on chrome-clad glass plates:

| Component | Amount |
|---|---|
| Cresol-formaldehyde resin binder | 1.0 g |
| Compound A- | 0.2 g |
| FC170C non-ionic fluorocarbon Surfactant obtained from 3M | 5.9 mg |
| 2-Ethoxyethyl acetate | 3.6 g |

The dried coated plates were prebaked at 90° C. for 30 minutes, then contact exposed through a quartz mask with an Optical Associates Instrument exposure device using a deep UV source and 220 nm mirrors for 30 sec. Upon exposure to an image of lines having widths and spacing of 1 μm or less, a bright blue image printed out. The exposed plates were developed in 1% aqueous sodium hydroxide for 15 sec at room temperature or in 1:3 tetramethylammonium hydroxide/water for 30 sec at room temperature. Crisp negative images were formed as unexposed areas were washed away rapidly. Image resolution was ≃0.5 μm. There was less than 1% thickness loss in the exposed areas, and no swelling had occurred on development.

EXAMPLE 2

Use with a Different Binder

A composition was prepared similar to that of Example 1 except that the novolak binder was replaced by 1.0 g of poly(4-hydroxystyrene). The composition was spin-coated at 4000 rpm on chrome-clad plates. As in Example 1 dried plate sample was prebaked, exposed, and processed in aqueous base. As in Example 1 a blue printout image was observed upon exposure and image resolution was $\simeq 0.5$ μm with less than 1% thickness loss observable in the exposed areas after processing. No swelling had occurred on development.

EXAMPLE 3

Use of Class 3 Compound

A compound was prepared similar to that of Example 2, except that the radiation-sensitive compound was 0.6 g of

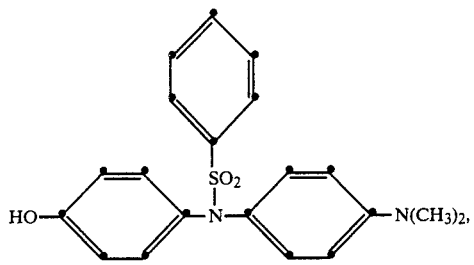

prepared with 6.4 g of cyclohexanone as the solvent. Exposure was for 40 sec, and development was for 10 sec in a solution containing 3 parts water and 1 part silicate-phosphate developer containing 1.45 parts by weight $Na_3PO_4.12H_2O$ and 1 part by weight $Na_2SiO_3.9H_2O$.

The invention has been described in detail with particular reference to preferred embodiments thereof, but it will be understood that variations and modifications can be effected within the spirit and scope of the invention.

What is claimed is:

1. A light-sensitive negative-working resist comprising a binder and a radiation-sensitive compound that, upon exposure to activating radiation, loses a moiety HX and is converted to a colored compound that is less soluble in an aqueous base than in said compound prior to said exposure, wherein X is selected from the group consisting of —CN, halide and —$SO_2R^1$ is alkyl comprising from 1 to 5 carbon atoms or aryl comprising from 6 to 10 carbon ring atoms, wherein said compound has the structural formula

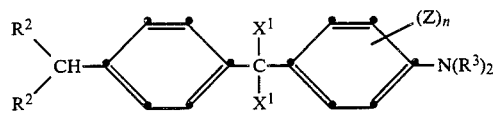

wherein $R^2$ and $X^1$ are individually selected from the group recited for said X, each $R^3$ is independently H, alkyl of from 1 to 5 carbon atoms, or benzyl, or together the two $R^3$ moieties form with said N atom, a heterocyclic ring of 5 to 6 ring atoms, or a pair of fused heterocyclic rings of 5 or 6 ring atoms each; n is 1 or 2 and Z is any substituent, or hydrogen, which on exposure to said radiation produces no increase in aqueous-base solubility.

2. A method of producing a negative-working image in a light-sensitive resist composition, comprising the steps of
   (a) imagewise-exposing to activating radiation a composition comprising a binder and, as the sole radiation-sensitive component of the composition, a sensitizer which functions to impart differential solubility to said composition as a result of said exposure and thereby render said composition developable in an aqueous base, said sensitizer comprising a radiation-sensitive compound that, upon exposure to activating radiation, loses a moiety HX and is converted to a colored compound that is less soluble in an aqueous base than is said compound prior to said exposure, wherein X is selected from the group consisting of —CN, halide and —$SO_2R^1$; and $R^1$ is alkyl comprising from 1 to 5 carbon atoms or aryl comprising from 6 to 10 carbon ring atoms, and
   (b) developing said exposed composition with an aqueous base so that only the exposed areas remain.

3. A method of producing a negative-working image in a light-sensitive resist composition, comprising the steps of
   (a) imagewise-exposing to activating radiation a composition comprising a binder and a radiation-sensitive compound that, upon exposure to activating radiation, loses a moiety HX and is converted to a colored compund that is less soluble in an aqueous base than is said compound prior to said exposure, wherein X is selected from the group consisting of —CN, halide and —$SO_2R^1$; and $R^1$ is alkyl comprising from 1 to 5 carbon atoms or aryl comprising from 6 to 10 carbon ring atoms, wherein said compound has the structural formula

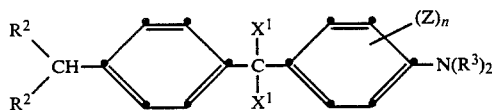

wherein $R^2$ and $X^1$ are individually selected from the group recited for said X, each $R^3$ is independently H, alkyl of from 1 of 5 carbon atoms, or benzyl, or together the two $R^3$ moieties form with said N atom, a heterocyclic ring of 5 to 6 ring atoms, or a pair of fused heterocyclic rings of 5 or 6 ring atoms each; n is 1 or 2 and Z is any substituent, or hydrogen, which on exposure to said radiation produces no increase in aqueous-base solubility, and
   (b) developing said exposed composition with an aqueous base so that only the exposed areas remain.

* * * * *

UNITED STATES PATENT AND TRADEMARK OFFICE
CERTIFICATE OF CORRECTION

PATENT NO. : 4,668,608
DATED : May 26, 1987
INVENTOR(S) : M. J. Lindstrom

It is certified that error appears in the above-identified patent and that said Letters Patent are hereby corrected as shown below:

Column 7, line 51, claim 1 "in" should read --is--;

line 53 after $-SO_2R^1$ should read --; and $R^1$--.

Column 8, line 5, claim 1 "hertero" should read --hetero--;

lines 14-15, claim 2 "radiaion-sensitive" should read --radiation-sensitive--; and line 54, claim 3 "1 of 5" should read --1 to 5--.

Signed and Sealed this

Twenty-second Day of December, 1987

Attest:

DONALD J. QUIGG

Attesting Officer      Commissioner of Patents and Trademarks